(12) United States Patent
Goto et al.

(10) Patent No.: US 9,920,424 B2
(45) Date of Patent: Mar. 20, 2018

(54) METHOD OF CLEANING THIN FILM FORMING APPARATUS, THIN FILM FORMING METHOD, THIN FILM FORMING APPARATUS AND NON-TRANSITORY RECORDING MEDIUM

(71) Applicant: TOKYO ELECTRON LIMITED, Tokyo (JP)

(72) Inventors: Ryota Goto, Nirasaki (JP); Rintaro Takao, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 664 days.

(21) Appl. No.: 14/138,752

(22) Filed: Dec. 23, 2013

(65) Prior Publication Data

US 2014/0187053 A1    Jul. 3, 2014

(30) Foreign Application Priority Data

Dec. 27, 2012 (JP) ................. 2012-284595

(51) Int. Cl.
*H01L 21/31* (2006.01)
*C23C 16/44* (2006.01)
*H01L 21/02* (2006.01)

(52) U.S. Cl.
CPC ...... *C23C 16/4405* (2013.01); *C23C 16/4407* (2013.01); *H01L 21/02041* (2013.01)

(58) Field of Classification Search
CPC ............ C23C 16/4405; C23C 16/4407; H01L 21/02041; H01L 21/02057;
(Continued)

(56) References Cited

U.S. PATENT DOCUMENTS 7,993,705 B2 *  8/2011  Nodera .............. C23C 16/4404
                                                       118/70
8,999,858 B2 *  4/2015  Koshi ............... H01L 21/02057
                                                       438/758

(Continued)

FOREIGN PATENT DOCUMENTS

JP          3-293726 A     12/1991
JP         11-312672 A     11/1999
                  (Continued)

*Primary Examiner* — Kevin M Picardat
(74) *Attorney, Agent, or Firm* — Nath, Goldberg & Meyer; Jerald L. Meyer

(57) ABSTRACT

A method of cleaning a thin film forming apparatus wherein a process for supplying a film forming gas into a reaction tube of the thin film forming apparatus to form a thin film on an object to be processed is repeated more than one time and then a cleaning gas is supplied into the reaction tube to remove extraneous particles attached to an interior of the apparatus, the method comprising: a first cleaning process including supplying a first cleaning gas into the reaction tube to remove the extraneous particles attached to the interior of the apparatus when a first cleaning start conditions is satisfied; and a second cleaning process including performing a cleaning process that is different from the first cleaning process when a second cleaning start condition that is different from the first cleaning start condition is satisfied.

4 Claims, 7 Drawing Sheets

(58) Field of Classification Search
CPC .................. H01L 21/02205–21/02222; H01L 21/2263–21/0228; H01L 21/0262; H01L 21/285–21/28593; H01L 21/3145; H01L 21/31604–21/31645; H01L 21/443; H01L 21/76876; H01L 51/001; H01L 21/02046–21/02049; H01L 21/02096; H01L 21/02052; C02F 2103/346
USPC .................. 438/5, 758; 118/70; 134/22.1
See application file for complete search history.

(56) References Cited

U.S. PATENT DOCUMENTS

| | | | | |
|---|---|---|---|---|
| 2002/0029791 | A1* | 3/2002 | Matsuoka | C23C 16/4407 134/18 |
| 2007/0184188 | A1* | 8/2007 | Kim | C23C 16/4408 427/248.1 |
| 2008/0268644 | A1* | 10/2008 | Kameda | C23C 16/4405 438/694 |
| 2010/0180913 | A1* | 7/2010 | Arena | C23C 16/4405 134/2 |
| 2011/0259370 | A1* | 10/2011 | Kameda | H01L 21/02271 134/22.1 |
| 2012/0015525 | A1* | 1/2012 | Endo | H01L 21/67109 438/758 |
| 2014/0011370 | A1* | 1/2014 | Kato | H01L 21/0206 438/782 |
| 2014/0060574 | A1* | 3/2014 | Wyse | B08B 7/00 134/3 |
| 2014/0116470 | A1* | 5/2014 | Su | C23C 16/4404 134/22.1 |
| 2015/0031216 | A1* | 1/2015 | Akae | C23C 16/345 438/763 |

FOREIGN PATENT DOCUMENTS

| | | |
|---|---|---|
| JP | 2003-45766 A | 2/2003 |
| JP | 2003-504881 A | 2/2003 |
| JP | 2003-277935 A | 10/2003 |
| JP | 2010-171389 A | 8/2010 |
| KR | 10-2007-0043640 A | 4/2007 |

* cited by examiner

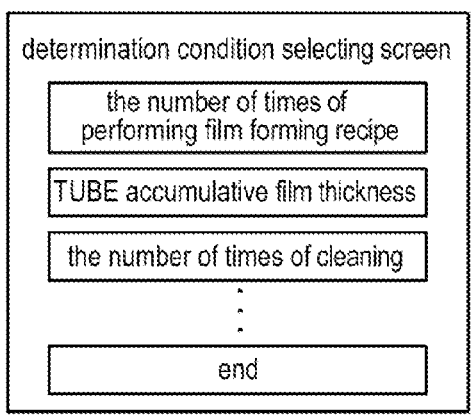

FIG. 4A

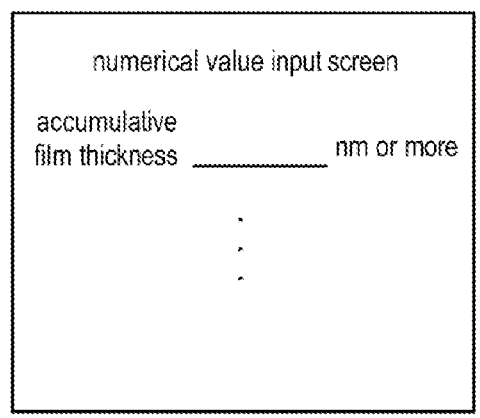

| STEP | recipe | determination condition | automatic clear |
|---|---|---|---|
| 1 | film forming A | --- | --- |
| 2 | cleaning A | accumulative film thickness > 500nm, and the number of times of cleaning < 20 times | clearing accumulative film thickness |
| 3 | cleaning B | accumulative film thickness > 500nm, and the number of times of cleaning ≥ 20 times | clearing the number of times of cleaning |
| END | --- | the number of times of the film forming: 500 times | --- |

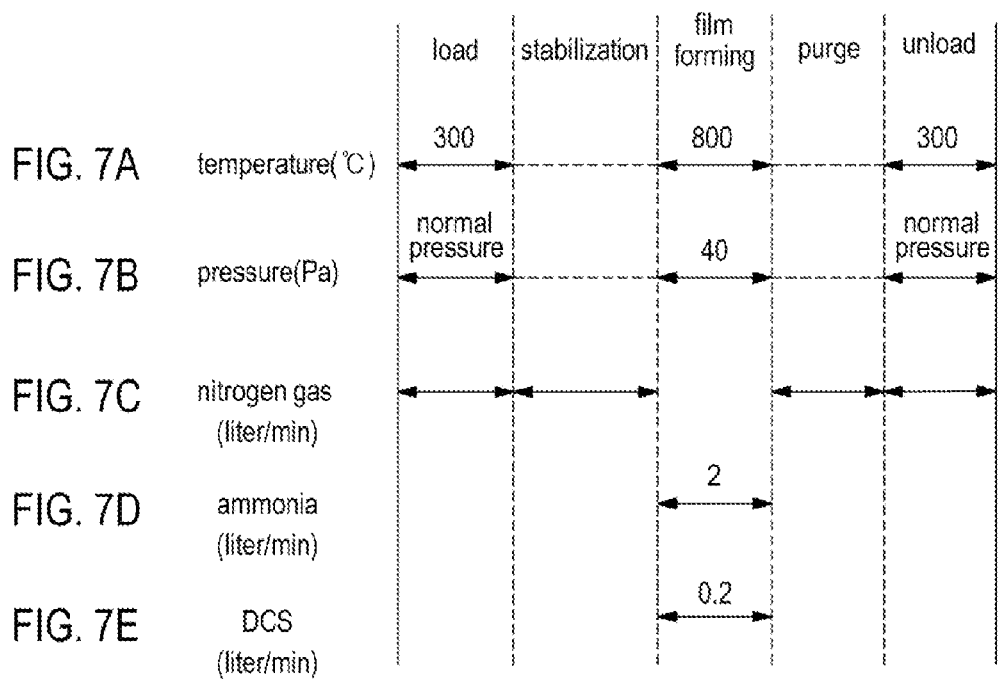
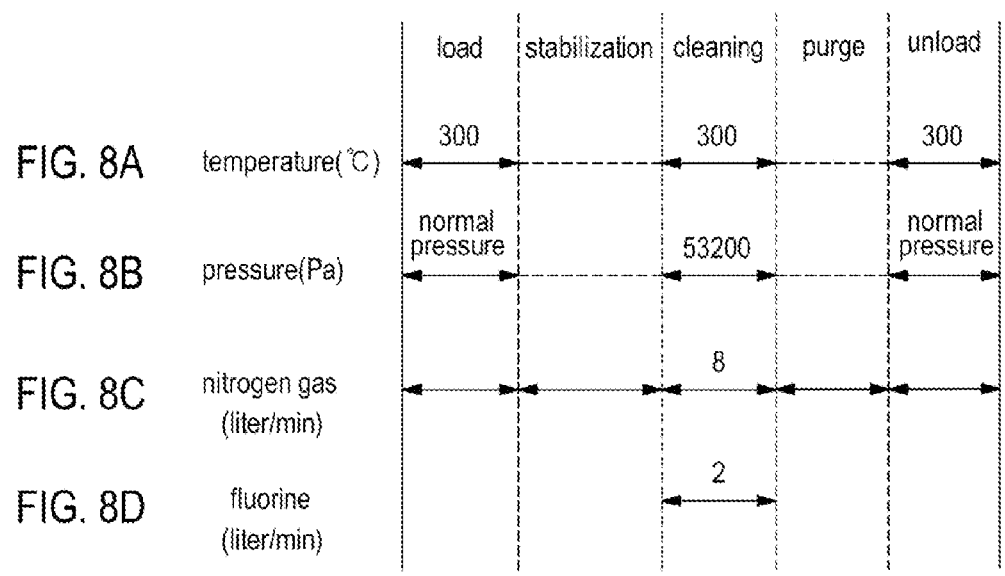

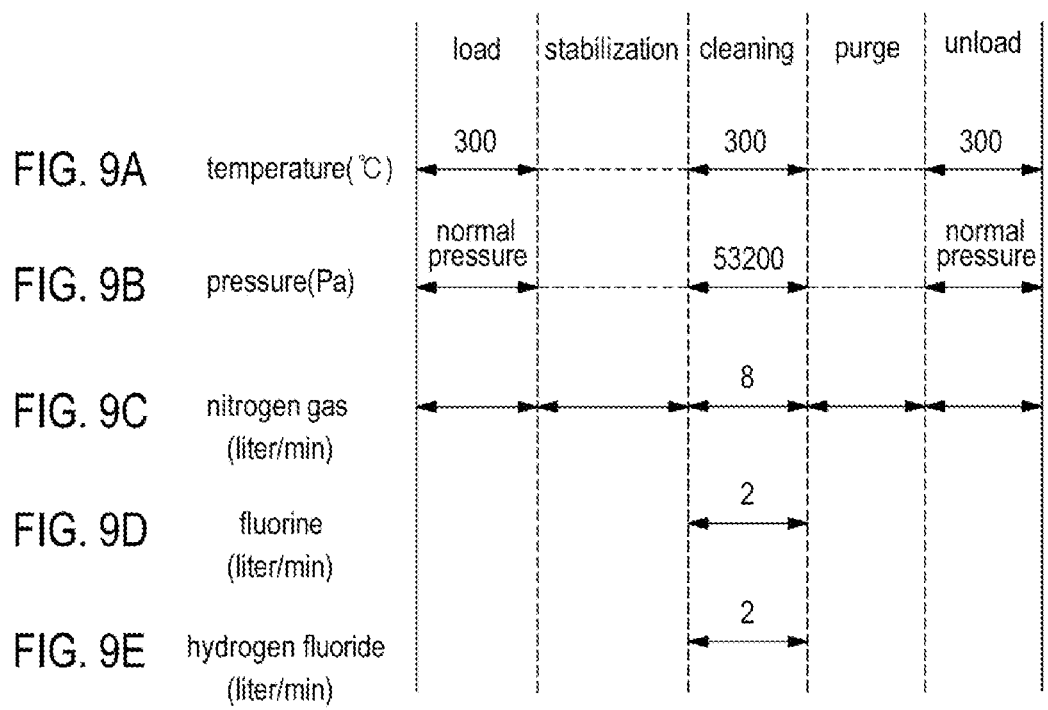

METHOD OF CLEANING THIN FILM FORMING APPARATUS, THIN FILM FORMING METHOD, THIN FILM FORMING APPARATUS AND NON-TRANSITORY RECORDING MEDIUM

CROSS-REFERENCE TO RELATED APPLICATION

This application claims the benefit of Japanese Patent Application No. 2012-284595, filed on Dec. 27, 2012, in the Japan Patent Office, the disclosure of which is incorporated herein in its entirety by reference.

TECHNICAL FIELD

The present disclosure relates to a method of cleaning a thin film forming apparatus, a thin film forming method, a thin film forming apparatus and a non-transitory recording medium.

BACKGROUND

In a process of manufacturing a semiconductor device, a thin film forming process is performed to form a thin film such as a poly-silicon film, a silicon nitride film and the like on an object to be processed, e.g., a semiconductor wafer, through a process such as chemical vapor deposition (CVD) or the like. In such a thin film forming process, the semiconductor wafer is accommodated into a reaction tube, which is heated at a predetermined temperature, and a film forming gas is supplied into the reaction tube to cause a thermal reaction to the film forming gas. A reaction product generated from the thermal reaction is deposited on a surface of the semiconductor wafer, thus forming a thin film on the surface of the semiconductor wafer.

However, the reaction product generated from the thin film forming process may be deposited (attached) on an interior of a heat treatment apparatus such as an inner wall of the reaction tube, various jigs and the like, as well as on the surface of the semiconductor wafer. When the thin film forming process continues in a state in which the reaction product (extraneous particles) is attached to the interior of the heat treatment apparatus, a stress is generated due to a difference in coefficient of thermal expansion between the extraneous particles and the quartz, which constitutes the reaction tube, and the quartz and the extraneous particles may be peeled by the stress. Consequently, particles are generated by the peeled quartz or extraneous particles and thus the yield of the semiconductor device to be manufactured may be decreased.

In order to solve this problem, a method of cleaning the heat treatment apparatus is suggested. In the method, a cleaning gas, for example, a mixture gas of fluorine and a halogen-containing acidic gas is supplied into the reaction tube, which is heated at a predetermined temperature by a heater, to remove (dry-etch) the reaction product attached to the interior of the heat treatment apparatus.

However, in the method of cleaning the heat treatment apparatus, there is a problem in that the cleaning may be excessively performed or may not be sufficiently performed because the cleaning is performed based on only one of the two conditions including a thickness of an accumulative thin film to be formed and the number of times of performing a thin film forming process, and also because only one type of cleaning recipe is available to perform. Further, there is also a problem in that the cleaning is oftentimes unnecessarily performed.

SUMMARY

The present disclosure provides a method of cleaning a thin film forming apparatus, a thin film forming method, a thin film forming apparatus and a recording medium capable of performing the cleaning in accordance with a situation of the apparatus.

According to one embodiment of the present disclosure, there is provided a method of cleaning a thin film forming apparatus wherein a process for supplying a film forming gas into a reaction tube of the thin film forming apparatus to form a thin film on an object to be processed is repeated more than one time and then a cleaning gas is supplied into the reaction tube to remove extraneous particles attached to an interior of the apparatus, the method comprising: a first cleaning process including supplying a first cleaning gas into the reaction tube to remove the extraneous particles attached to the interior of the apparatus when a first cleaning start conditions is satisfied; and a second cleaning process including performing a cleaning process that is different from the first cleaning process when a second cleaning start condition that is different from the first cleaning start condition is satisfied.

According to another embodiment of the present disclosure, there is provided a method of forming a thin film, comprising: a thin film forming process of supplying a film forming gas into a reaction tube in which an object to be processed is accommodated, to form a thin film on the object; a cleaning process of cleaning a thin film forming apparatus by a method according to one embodiment.

According to yet another embodiment of the present disclosure, there is provided a thin film forming apparatus for supplying a film forming gas into a reaction tube of the thin film forming apparatus to form a thin film on an object to be processed and removing extraneous particles attached to an interior of the thin film forming apparatus by forming the thin film, the apparatus comprising: a first cleaning process unit configured to perform a first cleaning process including supplying a first cleaning gas into the reaction tube to remove the extraneous particles attached to the interior of the apparatus when a first cleaning start condition is satisfied; and a second cleaning process unit configured to perform a cleaning process that is different from the first cleaning process when a second cleaning start condition that is different from the first cleaning start process is satisfied.

According to yet another embodiment of the present disclosure, there is provided a non-transitory storage medium for storing a computer program used in a thin film forming apparatus configured to supply a film forming gas into a reaction tube of the thin film forming apparatus to form a thin film on an object to be processed and remove an extraneous particles attached to an interior of the thin film forming apparatus, the computer program comprising: a first cleaning process instruction set to perform a first cleaning process including supplying a first cleaning gas into the reaction tube to remove the extraneous particles attached to the interior of the apparatus when a first cleaning start condition is satisfied; and a second cleaning process instruction set to perform a cleaning process that is different from the first cleaning process when a second cleaning start condition that is different from the first cleaning start process is satisfied.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 4A and 4B are diagrams showing an example of a display screen of a manipulation panel for illustrating a processing recipe registration process.

FIG. 5 is a diagram showing an example of a processing recipe.

FIGS. 7A to 7E are diagrams showing an example of a film forming recipe.

FIGS. 8A to 8D are diagrams showing an example of a cleaning recipe of a cleaning process A.

FIGS. 9A to 9E are diagrams showing an example of a cleaning recipe of a cleaning process B.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, a case in which a cleaning method of a thin film forming apparatus, a thin film forming method, a thin film forming apparatus and a recording medium according to the present disclosure are applied to a batch type vertical heat treatment apparatus shown in FIG. 1 will be described as an example.

Figure 1:
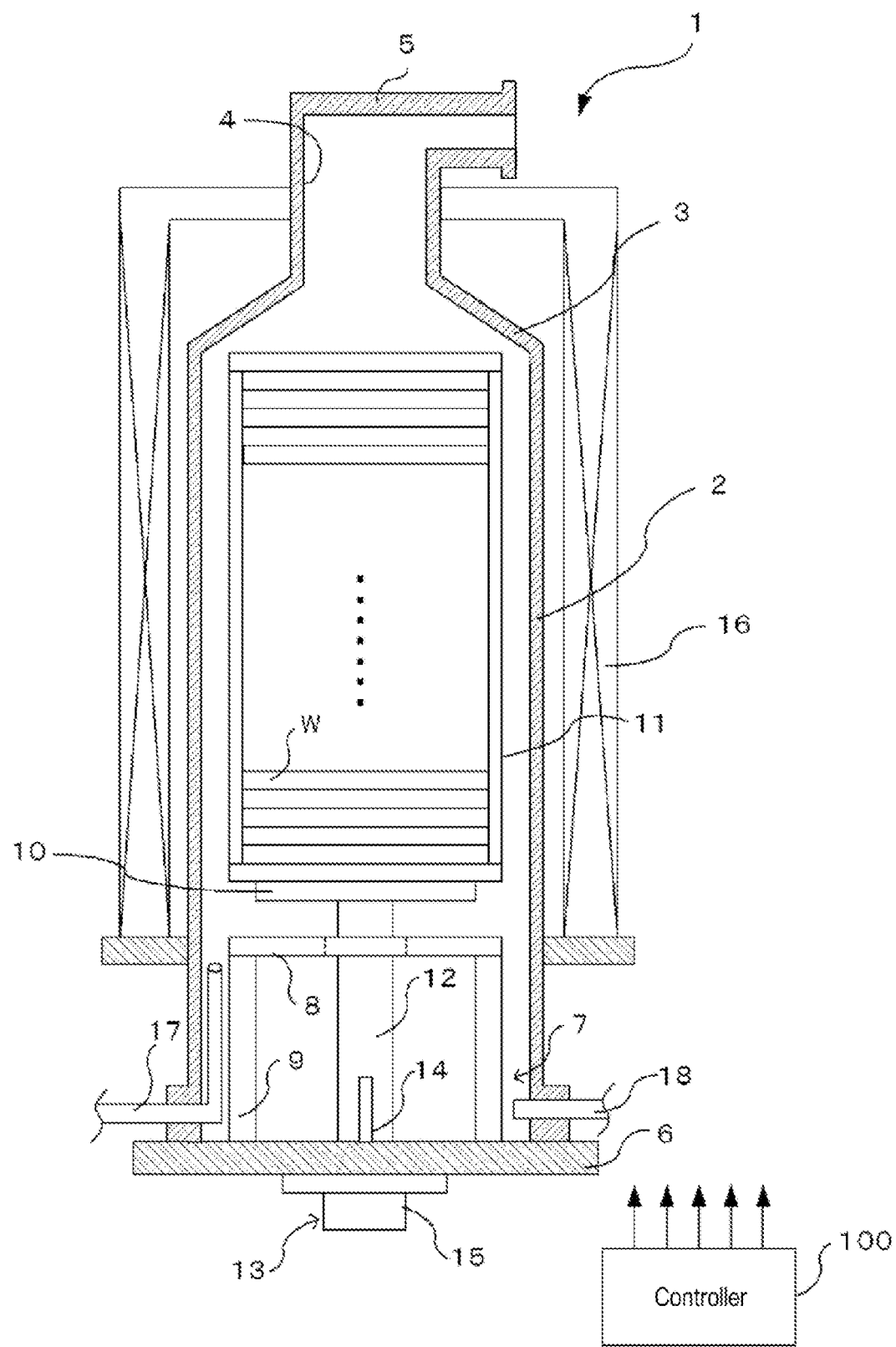
FIG. 1 is a diagram showing a structure of a heat treatment apparatus according to one embodiment.

As shown in FIG. 1, a heat treatment apparatus 1 as a thin film forming apparatus includes a reaction tube 2. The reaction tube 2 has, for example, a substantially cylindrical shape whose longitudinal direction is along a vertical direction. The reaction tube 2 is made of a material, e.g., quartz, having excellent heat resistance and corrosion resistance.

A top portion 3 having a substantially conical shape is located at an upper end portion of the reaction tube 2 such that a diameter thereof is reduced toward an upper end portion of the top portion 3. An exhaust hole 4 is located at the center of the upper end portion of the top portion 3 in order to exhaust gas within the reaction tube 2, and an exhaust pipe 5 is airtightly connected to the exhaust hole 4. A pressure adjustment mechanism such as a valve (not shown), a vacuum pump 127 to be described later, and the like are located at the exhaust pipe 5 to control the interior of the reaction tube 2 to have a desired pressure (vacuum degree).

A cover 6 is disposed at a lower end portion of the reaction tube 2. The cover 6 is made of a material, e. g., quartz, having excellent heat resistance and corrosion resistance. In addition, the cover 6 is configured to move up and down by a boat elevation unit 128 to be described later. When the cover 6 is lifted by the boat elevation unit 128, the lower portion (throat portion) of the reaction tube 2 is closed, and when the cover 6 is lowered by the boat elevation unit 128, the lower portion (throat portion) of the reaction tube 2 is opened.

A warming container 7 is located at an upper portion of the cover 6. The warming container 7 includes a planar heater 8 configured as a resistance heating element for preventing a temperature drop within the reaction tube 2 due to heat dissipation from the throat portion of the reaction tube 2, and a cylindrical support 9 for supporting the heater 8 at a predetermined height from an upper surface of the cover 6.

Further, a rotary table 10 is located at an upper portion of the warming container 7. The rotary table 10 serves as a loading table for rotatably loading a wafer boat 11 which accommodates an object to be processed, e.g., a semiconductor wafer W. Specifically, a rotary prop 12 is installed at a lower side of the rotary table 10, and the rotary prop 12 is configured to penetrate a central portion of the heater 8 and is connected to a rotary mechanism 13 for rotating the rotary table 10. The rotary mechanism 13 includes a motor (not shown) and a rotary introduction part 15 having a rotary shaft 14 configured to airtightly penetrate from a lower surface to an upper surface of the cover 6. The rotary shaft 14 is connected to the rotary prop 12 and transfers the rotary power of the motor to the rotary table 10 through the rotary prop 12. Accordingly, when the rotary shaft 14 is rotated by the motor of the rotary mechanism 13, the rotary power of the rotary shaft 14 is transferred to the rotary prop 12 to rotate the rotary table 10.

A wafer boat 11 is configured to accommodate a plurality of sheets of the semiconductor wafers W at predetermined intervals in a vertical direction. The wafer boat 11 is made of a material, e.g., quartz. The wafer boat 11 is loaded on the rotary table 10. As a result, when the rotary table 10 is rotated, the wafer boat 11 is also rotated, and accordingly, the semiconductor wafers W accommodated within the wafer boat 11 are rotated.

A heater 16 for temperature elevation includes, for example, a resistance heating element that surrounds the reaction tube 2. The interior of the reaction tube 2 is heated to a predetermined temperature by the heater 16, and as a result, the semiconductor wafers W are heated to a predetermined temperature.

A treatment gas introduction pipe 17, which introduces a treatment gas into the reaction tube 2, penetrates a side wall in the vicinity of a lower end portion of the reaction tube 2. The treatment gas introduced into the reaction tube 2 includes, for example, a film forming gas for forming a thin film on the semiconductor wafer, or a cleaning gas for removing (cleaning) extraneous particles (reaction product) attached to the interior of the heat treatment apparatus 1, and the like.

A desired gas in accordance with the type of the thin film to be formed on the semiconductor wafer W is used as the film forming gas. For example, when a silicon nitride film is formed on the semiconductor wafer W dichlorosilane (DSC: $SiH_2Cl_2$) and ammonia ($NH_3$), or hexachlorodisilane (HCD: $Si_2Cl_6$) and ammonia ($NH_3$), and the like are used as the film forming gas. Alternatively, when a poly-silicon film is formed on the semiconductor wafer W, for example, monosilane ($SiH_4$) is used as the film forming gas.

A gas capable of removing (cleaning) the extraneous particles attached to the interior of the heat treatment apparatus 1 is used as the cleaning gas. For example, when the silicon nitride film is formed on the semiconductor wafer W, a mixture gas of fluorine and nitrogen as a dilution gas, a mixture gas of fluorine, hydrogen fluoride (HF) and nitrogen, a mixture gas of fluorine, chorine trifluoride ($ClF_3$) and nitrogen, and the like are used as the cleaning gas.

The treatment gas introduction pipe 17 is connected to a treatment gas supply source (not shown) through a mass flow controller (MFC) 125 to be described later. Although FIG. 1 shows only one treatment gas introduction pipe 17, a plurality of treatment gas introduction pipes 17 may be disposed in accordance with the type of gas to be introduced into the reaction tube 2. In the embodiment, the film forming gas introduction pipe, which introduces the film forming gas into the reaction tube 2, and the cleaning gas introduction pipe, which introduces the cleaning gas into the reaction tube 2, penetrate the side wall in the vicinity of a lower end portion of the reaction tube 2.

Also, a purge gas supply pipe 18 penetrates a lateral surface in the vicinity of the lower end portion of the reaction tube 2. The purge gas supply pipe 18 is connected to a purge gas supply source (not shown) through the MFC 125 to be described later. Therefore, a desired amount of purge gas, for example, a nitrogen gas is supplied into the reaction tube 2 through the purge gas supply pipe 18 from the purge gas supply source.

Figure 2:
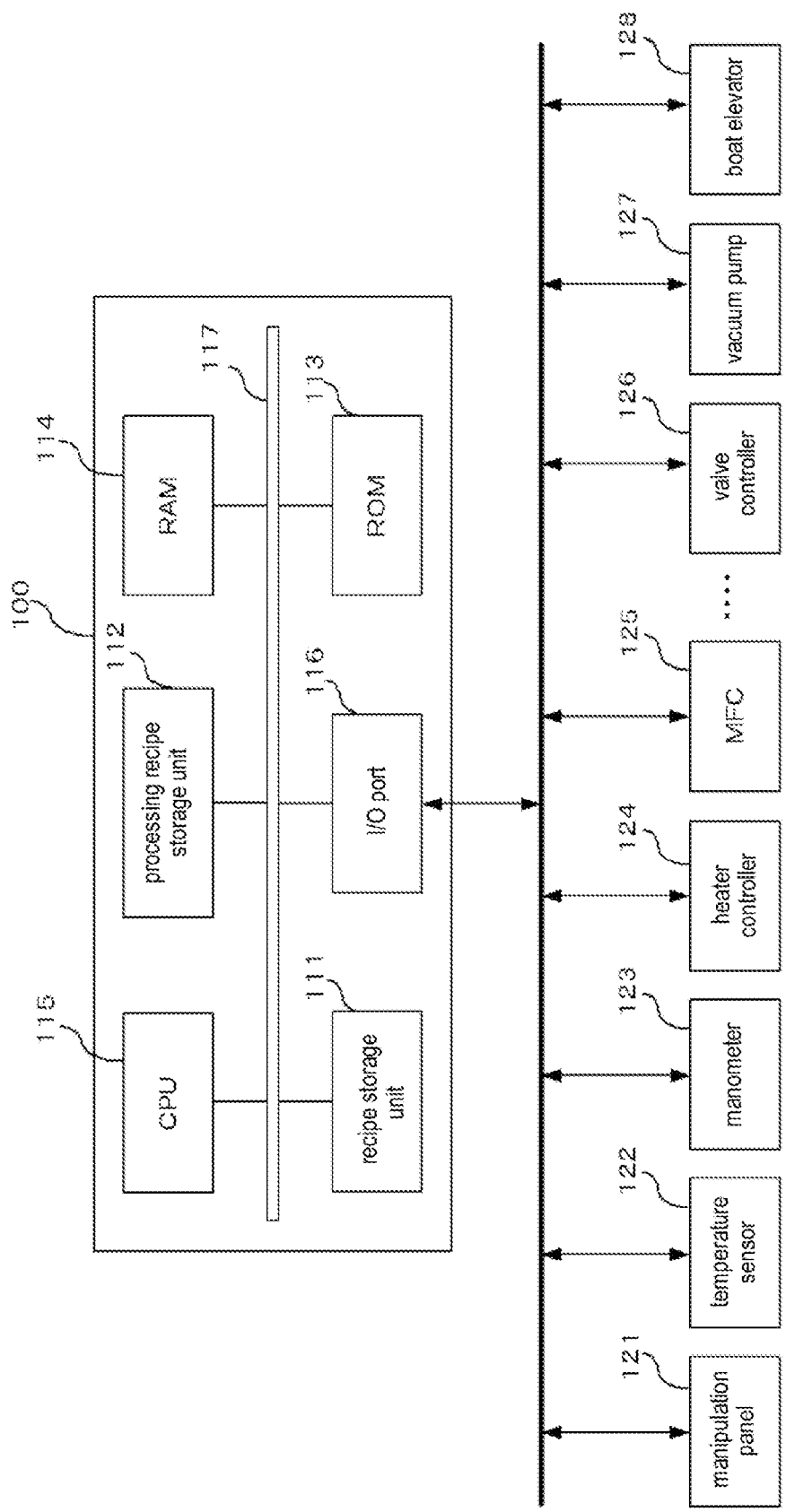
FIG. 2 is a diagram of an example configuration of a controller of FIG. 1.

The heat treatment apparatus 1 further includes a controller 100 for controlling respective portions of the heat treatment apparatus 1. FIG. 2 shows a configuration of the controller 100. As shown in FIG. 2, a manipulation panel 121, a temperature sensor (group) 122, a manometer (group) 123, a heater controller 124, MFCs 125, valve controllers 126, a vacuum pump 127, a boat elevation unit 128, and the like are connected to the controller 100.

The manipulation panel 121 includes a display screen and a manipulation button. The manipulation panel 121 transfers a manipulation instruction from an operator to the controller 100. Also, the manipulation panel 121 displays various types of information from the controller 100 on the display screen.

The temperature sensor (group) 122 measures a temperature of respective portions within the reaction tube 2 and the exhaust pipe 5, and notifies the controller 100 of the temperature measurement values. The manometer (group) 123 measures a pressure of respective portions within the reaction tube 2 and the exhaust pipe 5, and notifies the controller 100 of the pressure measurement values.

The heater controller 124 individually controls the heater 8 and the heater 16. The heater controller 124 is electrically connected to the heater 8 and the heater 16 to heat the heater 8 and the heater 16 in response to an instruction from the controller 100. Also, the heater controller 124 individually measures power consumption of the heater 8 and the heater 16, and notifies the controller 100 of the power consumption measurement values.

The MFCs 125 are installed at respective pipes such as the treatment gas introduction pipe 17, the purge gas supply pipe 18 and the like. The MFCs 125 controls a flow rate of gases, which flow through the respective pipes, into an amount indicated by the controller 100, which measures an actual flow rate of the gases, and notifies the controller 100 of the actual flow rate measurement values.

The valve controllers 126 are installed at the respective pipes. The valve controllers 126 control an opening degree of the valves installed at the respective pipes into a value indicated by the controller 100. The vacuum pump 127 is connected to the exhaust pipe 5 and exhausts the gas within the reaction tube 2.

The boat elevation unit 128 lifts the cover 6 to load the wafer boat 11 (semiconductor wafers W) loaded on the rotary table 10 into the reaction tube 2, and lowers the cover 6 to unload the wafer boat 11 (semiconductor wafers W) loaded on the rotary table 10 from the interior of the reaction tube 2.

The controller 100 includes a recipe storage unit 111, a processing recipe storage unit 112, a read only memory (ROM) 113, a random access memory (RAM) 114, a central processing unit 115, an input/output (I/O) port 116, and a bus 117 for connecting these elements.

The recipe storage unit 111 stores a plurality of recipes used to determine a control procedure in accordance with the type of treatment executed by the heat treatment apparatus 1. The recipes are prepared for each treatment (process) actually performed by the user. Each recipe defines the film forming process, a temperature change of respective portions in the cleaning process, a pressure change within the reaction tube 2, a timing for starting and stopping the supply of the treatment gas, an amount of the supply of the treatment gas, and the like.

The processing recipe storage unit 112 specifies and stores a recipe (i.e., processing recipe) which will be or is currently being used in the thin film forming process, selected from the recipes stored in the recipe storage unit 111. The processing recipe includes: (i) a film forming recipe for forming the thin film on the semiconductor wafer W; (ii) a cleaning recipe for cleaning the extraneous particles attached to the interior of the reaction tube 2 in accordance with the thin film forming; (iii) a plurality of cleaning recipes according to a state within the reaction tube 2 such as the number of times of performing the film forming recipe and the like; and (iv) a start condition of each cleaning recipe, and the like. The processing recipe will be described later.

The ROM 113 includes an electrically erasable programmable read only memory (EEPROM), a flash memory, a hard disk and the like, and is a storage medium for storing an operation program of the CPU 115 and the like. The RAM 114 serves as a work area of the CPU 115 and the like.

The CPU 115 serves as a central function of the controller 100. The CPU 115 executes a control program stored in the ROM 113, and controls the operation of the heat treatment apparatus 1 in accordance with the processing recipe stored in the processing recipe storage unit 112 based on the instruction from the manipulation panel 121. That is, the CPU 115 controls the temperature sensor (group) 122, the manometer (group) 123, the MFC 125 and the like to measure the temperature, pressure, flow rate and the like of each portion within the reaction tube 2, the exhaust pipe 5 and the treatment gas introduction pipe 17, and the purge gas supply pipe 18. Further, based on the measured data, the CPU 115 outputs a control signal and the like to the heater controller 124, the MFC 125, the valve controller 126, the vacuum pump 127 and the like, and the CPU 115 controls each portion so that they follow the recipe.

The I/O port 116 is connected to the manipulation panel 121, the temperature sensor (group) 122, the manometer (group) 123, the heater controller 124, the MFC 125, the valve controller 126, the vacuum pump 127, the boat elevation unit 128 and the like. The I/O port 116 controls the input and output of data or signals. The bus 117 delivers information between the respective portions.

Next, the processing recipe stored in the processing recipe storage unit 112 will be described. As described above, the processing recipe refers to a recipe to be used in a thin film forming process that is specified based on the recipes stored in the recipe storage unit 111. Further, the processing recipe describes the contents of the thin film forming process (e.g., contents of the film forming process and the cleaning process) that has been registered or specified by the operator of the heat treatment apparatus 1. Hereinafter, a registration of the processing recipe (processing recipe registration process) will be described.

The present embodiment will be described with reference to FIG. 5 as an example. According to the processing recipe of this embodiment, while performing the thin film forming process (film forming A) for forming the silicon nitride film by using DSC and ammonia as a film forming gas, if the TUBE accumulative film thickness is equal to or more than 500 nm and the number of times of cleaning is less than 20, the cleaning process A is performed by using the mixture gas of fluorine and nitrogen as the cleaning gas, and if the TUBE accumulative film thickness is equal to or more than 500 nm and the number of times of cleaning is equal to or more than 20, the cleaning process B is performed by using the mixture gas of fluorine, hydrogen fluoride and nitrogen as the cleaning gas.

Figure 3A:
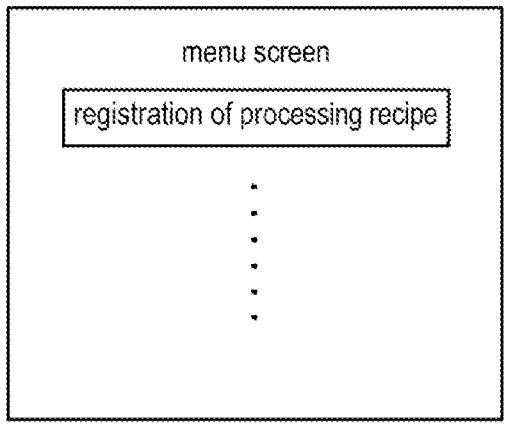
FIGS. 3A to 3D are diagrams showing an example of a display screen of a manipulation panel for illustrating a processing recipe registration process.
Figure 3B:
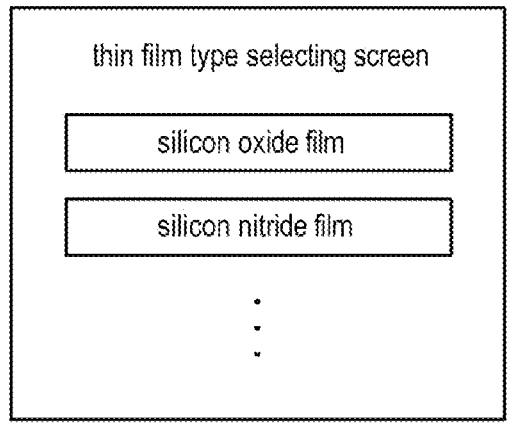

First, the operator selects "registration of processing recipe" from a menu screen of the manipulation panel 121 as shown in FIG. 3A by manipulating the manipulation panel 121. When the "registration of processing recipe" is selected, the CPU 115 displays on the manipulation panel 121 a thin film type selecting screen regarding types of thin films, which can be formed by the processing recipe stored in the processing recipe storage unit 112, as shown in FIG. 3B. The operator selects "silicon nitride film" from the thin film type selecting screen by manipulating the manipulation panel 121.

Figure 3C:
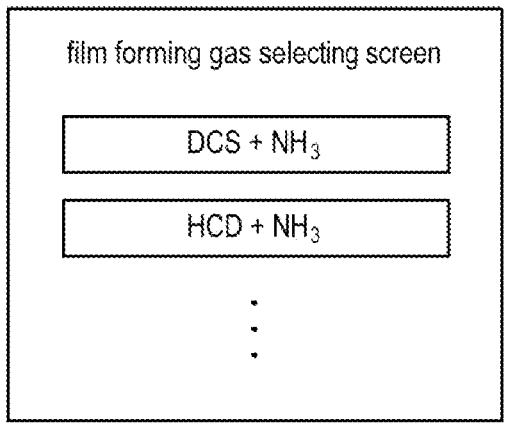

When the "silicon nitride film" is selected, the CPU 115 displays on the manipulation panel 121 a film forming gas selecting screen regarding types of film forming gases of a film forming recipe for forming the silicon nitride film from the processing recipes stored in the processing recipe storage unit 112, as shown in FIG. 3C. The operator selects "DCS+NH3" from the film forming gas selecting screen by manipulating the manipulation panel 121. As a result, the film forming recipe is specified. When the film forming recipe is selected, details of the film forming recipe are displayed on the manipulation panel 121, and then the operator sets detail contents such as a film thickness of the thin film (e.g., 50 nm), the number of repetitions of the film forming recipe (e.g., 500 times) and the like by manipulating the manipulation panel 121.

Figure 3D:
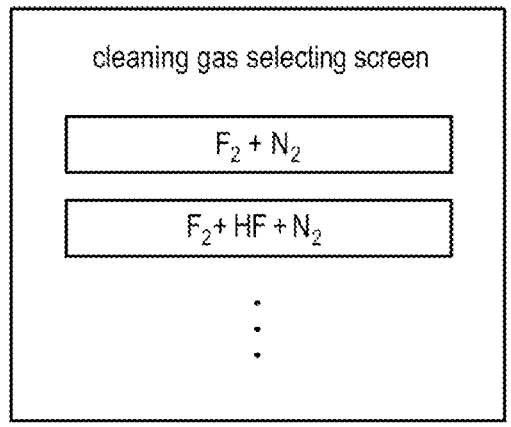

Next, the CPU 115 displays on the manipulation panel 121 a cleaning gas selecting screen regarding types of the cleaning gases of a cleaning recipe, which is usable to clean the silicon nitride film from the processing recipes stored in the processing recipe storage unit 112, as shown in FIG. 3D. The operator selects "$F_2+N_2$" (mixture gas of fluorine and nitrogen) from the cleaning gas selecting screen by manipulating the manipulation panel 121. As a result, the cleaning recipe of the cleaning process A is specified.

When the cleaning recipe is specified, the CPU 115 displays a determination condition selecting screen on the manipulation panel 121, as shown in FIG. 4A. The operator selects "TUBE accumulative film thickness" from determination conditions of the specified cleaning recipe by manipulating the manipulation panel 121. When the "TUBE accumulative film thickness" is selected, the CPU 115 displays a numerical value input screen on the manipulation panel 121, as shown in FIG. 4B. The operator inputs "500 nm" by manipulating the manipulation panel 121. As a result, the determination (start) condition of the cleaning process A is specified.

When the determination condition of the cleaning process A is specified, the CPU 115 displays a cleaning gas selecting screen shown in FIG. 3D on the manipulation panel 121. The operator selects "$F_2+HF+N_2$" (mixture gas of fluorine, hydrogen fluoride and nitrogen) from the cleaning gas selecting screen by manipulating the manipulation panel 121. As a result, the cleaning recipe of a cleaning process B is specified.

When the cleaning recipe of the cleaning process B is specified, the CPU 115 displays the determination condition selecting screen shown in FIG. 4A on the manipulation panel 121. The operator selects "TUBE accumulative film thickness" and "the number of times of cleaning" from the determination condition selecting screen by manipulating the manipulation panel 121. When the "TUBE accumulative film thickness" is selected, the CPU 115 displays the numerical value input screen shown in FIG. 4B on the manipulation panel 121. The operator inputs "500 nm" to the accumulative film thickness and "20 times" to the number of times of cleaning by manipulating the manipulation panel 121. As a result, the determination (start) condition of the cleaning process B is specified.

When the determination condition of the cleaning process B is specified, the CPU 115 displays the cleaning gas selecting screen shown in FIG. 3D on the manipulation panel 121. The operator selects "complete" from the cleaning gas selecting screen by manipulating the manipulation panel 121. As a result, the contents specified by the processing recipe registration process are stored in the processing recipe storage unit 112, and the processing recipe registration process is completed.

Figure 6:
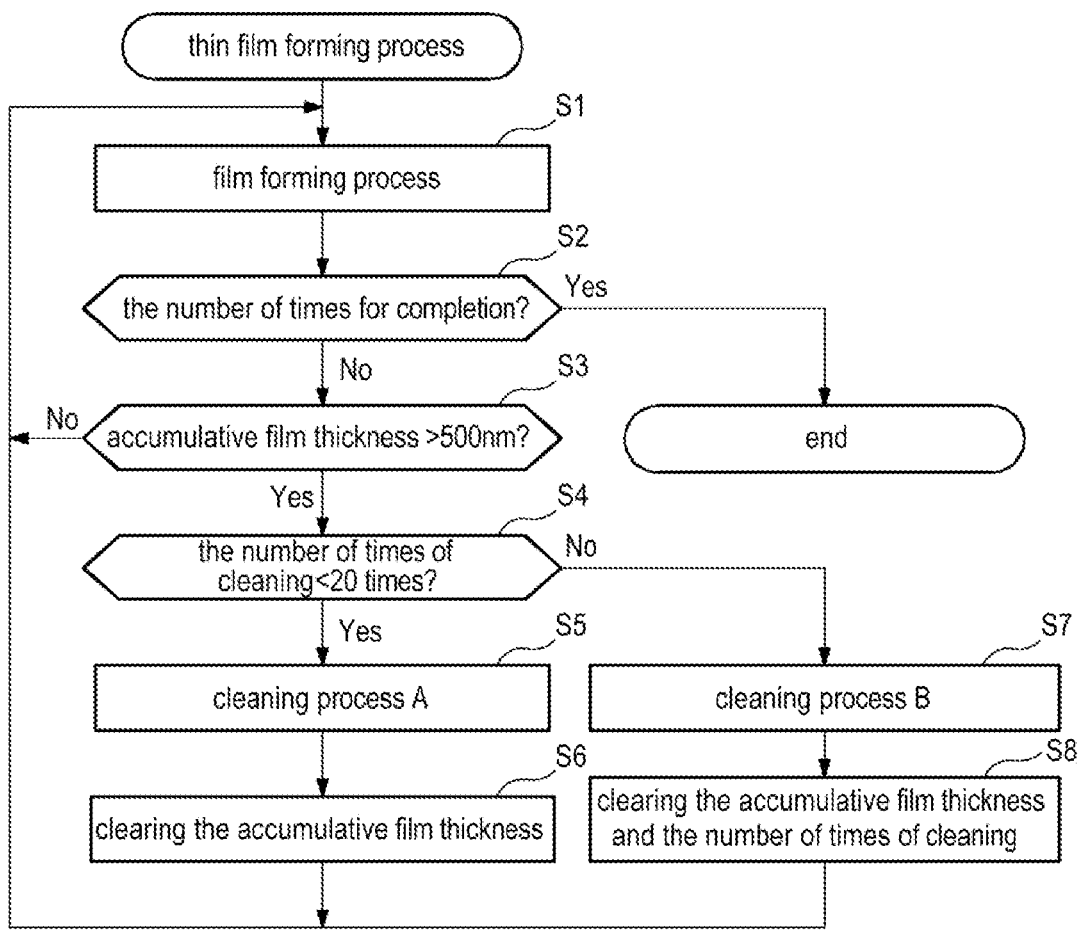
FIG. 6 is a flow chart showing an example of a thin film forming process.

Next, a thin film forming method of forming a thin film on the object and a method of cleaning a thin film forming apparatus using the heat treatment apparatus 1 configured as mentioned above will be described. The present embodiment will be described with an example where a thin film forming process executes the processing recipe shown in FIG. 5. FIG. 6 is a flowchart of the thin film forming process.

In the following description, the operations of the respective portions, which constitute the heat treatment apparatus 1, are controlled by the controller 100 (CPU 115). Also, as mentioned above, the controller 100 (CPU 115) controls the heater controller 124 (heater 8, heater 16), the MFC 125 (treatment gas introduction pipes 17, purge gas supply pipe 18), the valve controller 126, the vacuum pump 127 and the like such that the temperature, the pressure, the gas flow rate and the like within the reaction tube 2 in the respective processes are in conformity with the conditions of the recipes.

The CPU 115 performs the film forming process in accordance with the film forming recipe, which is specified in the processing recipe storage unit 112 and is stored in the recipe storage unit 111 (step S1). Hereinafter, the film forming process will be described. FIGS. 7A to 7E show an example of the film forming recipe.

First, the CPU 115 sets the interior of the reaction tube 2 to have a predetermined temperature, for example, 300 degrees C. as shown in FIG. 7A. In addition, as shown in FIG. 7C, a predetermined amount of nitrogen is supplied into the reaction tube 2 from the purge gas supply pipe 18, and the wafer boat 11, accommodating the semiconductor wafer W on which a silicon nitride film is to be formed, is loaded on the cover 6. Then, the cover 6 is lifted by the boat elevation unit 128 to load the semiconductor wafer W (e.g., wafer boat 11) into the reaction tube 2 (loading process).

Next, as shown in FIG. 7C, a predetermined amount of nitrogen is supplied into the reaction tube 2 from the purge gas supply pipe 18, and the interior of the reaction tube 2 is set to have a predetermined temperature, for example, 800 degrees C. as shown in FIG. 7A. In addition, the gas within the reaction tube 2 is discharged to decompress the interior of the reaction tube 2 to have a predetermined pressure, for example, 40 Pa (0.3 Torr) as shown in FIG. 7B. The decompression and the temperature continue to be controlled until the interior of the reaction tube 2 is stabilized at the predetermined pressure and the predetermined temperature (stabilization process).

When the interior of the reaction tube 2 is stabilized at the predetermined pressure and temperature, the supply of nitrogen from the purge gas supply pipe 18 is stopped, and the film forming gas is introduced into the reaction tube 2 from the treatment gas introduction pipe 17. In this embodiment, the film forming gas including 2 liters per minute of ammonia as shown in FIG. 7D and 0.2 liters per minute of DCS as shown in FIG. 7E is introduced into the reaction tube 2. The film forming gas introduced into the reaction tube 2 is heated within the reaction tube 2, and the silicon nitride film is formed on a surface of the semiconductor wafer W (film forming process).

When the silicon nitride film having a predetermined thickness, for example, 50 nm is formed on the surface of the semiconductor wafer W, the introduction of the film forming gas from the treatment gas introduction pipe 17 is stopped. Then, the gas within the reaction tube 2 is discharged, and a predetermined amount of nitrogen is supplied into the reaction tube 2 from the purge gas supply pipe 18 as shown in FIG. 7C to discharge the gas within the reaction tube 2 to the exhaust pipe 5 (purge process). Further, in order to reliably discharge the gas within the reaction tube 2, discharging the gas within the reaction tube 2 and supplying the nitrogen gas are preferably repeated several times according to one embodiment.

Then, a predetermined amount of nitrogen is supplied into the reaction tube 2 from the purge gas supply pipe 18 as shown in FIG. 7C to return the interior of the reaction tube 2 to a normal pressure as shown in FIG. 7B. In addition, the interior of the reaction tube 2 is set to have a predetermined temperature, for example, 300 degrees C. as shown in FIG. 7A. Then, the cover 6 is lowered by the boat elevation unit 128 to unload the semiconductor wafer W (wafer boat 11) from the reaction tube 2 (unloading process). Accordingly, the film forming process is completed. Also, when the film forming process is completed, the CPU 115 stores accumulative film thickness value after the film forming process.

Next, the CPU 115 determines whether the film forming process is performed the number of times for completion (e.g., 500 times as shown in FIG. 5) or not (step S2). If it is determined that the film forming process is performed the number of times for completion (step S2: Yes), the film forming process is completed.

If it is determined that the film forming process is not performed the number of times for completion (step S2: No), the CPU 115 determines whether the TUBE accumulative film thickness is thicker than 500 nm or not (step S3). If it is determined that the TUBE accumulative film thickness is thinner than 500 nm (step S3: No), the flow returns to step S1, and the film forming process is performed in a similar manner as described above.

If it is determined that the TUBE accumulative film thickness is thicker than 500 nm (step S3: Yes), the CPU 115 determines whether the number of times of cleaning is smaller than 20 times (step S4). If it is determined that the number of times of cleaning is smaller than 20 times (step S4: Yes), the cleaning process A is performed (step S5). Hereinafter, the cleaning process A will be described. FIGS. 8A to 8D show an example of the cleaning recipe of the cleaning process A.

First, the CPU 115 sets the interior of the reaction tube 2 to have a predetermined temperature, for example, 300 degrees C. as shown in FIG. 8A. In addition, as shown in FIG. 8C, a predetermined amount of nitrogen is supplied into the reaction tube 2 from the purge gas supply pipe 18, and an empty wafer boat 11 in which a semiconductor wafer W is not accumulated is loaded on the cover 6. Then, the cover 6 is lifted by the boat elevation unit 128 to load the wafer boat 11 into the reaction tube 2 (loading process).

Next, as shown in FIG. 8C, a predetermined amount of nitrogen is supplied into the reaction tube 2 from the purge gas supply pipe 18, and the interior of the reaction tube 2 is set to have a predetermined temperature, for example, 300 degrees C. as shown in FIG. 8A. In addition, the gas within the reaction tube 2 is discharged to decompress the interior of the reaction tube 2 to have a predetermined pressure, for example, 53200 Pa (400 Torr) as shown in FIG. 8B. The decompression and the temperature continue to be controlled until the interior of the reaction tube 2 is stabilized at the predetermined pressure and the predetermined temperature (stabilization process).

When the interior of the reaction tube 2 is stabilized at the predetermined pressure and temperature, the supply of nitrogen from the purge gas supply pipe 18 is stopped, and the cleaning gas is introduced into the reaction tube 2 from the treatment gas introduction pipe 17. In this embodiment, the cleaning gas including 2 liters per minute of fluorine ($F_2$) as shown in FIG. 8D and 8 liters per minute of nitrogen as a dilution gas as shown in FIG. 8C is introduced into the reaction tube 2.

When the cleaning gas is introduced into the reaction tube 2, the cleaning gas is heated within the reaction tube 2, and fluorine included in the cleaning gas is activated. The activated fluorine contacts the extraneous particles (silicon nitride) attached to the interior of the heat treatment apparatus 1 such that the silicon nitride is etched. Accordingly, the extraneous particles attached to the interior of the heat treatment apparatus 1 are removed (cleaning process).

When the extraneous particles attached to the interior of the heat treatment apparatus 1 are removed, the supply of the cleaning gas from the treatment gas introduction pipe 17 is stopped. Then, the gas within the reaction tube 2 is discharged, and a predetermined amount of nitrogen is supplied into the reaction tube 2 from the purge gas supply pipe 18 as shown in FIG. 8C to discharge the gas within the reaction tube 2 to the exhaust pipe 5 (purging process). Further, in order to reliably discharge the gas within the reaction tube 2, discharging the gas within the reaction tube 2 and supplying the nitrogen gas can be repeated several times in some embodiments.

Then, a predetermined amount of nitrogen is supplied into the reaction tube 2 from the purge gas supply pipe 18 as shown in FIG. 8C to return the interior of the reaction tube 2 to the normal pressure as shown in FIG. 8B. In addition, the interior of the reaction tube 2 is set to have a predetermined temperature, for example 300 degrees C. as shown in FIG. 8A. Finally, the cover 6 is lowered by the boat elevation unit 128 to unload the wafer boat 11 from the reaction tube 2 (unloading process). Accordingly, the cleaning process A is completed.

When the cleaning process A is completed, the CPU 115 clears the stored accumulative film thickness value (step S6). In addition, the CPU 115 stores the number of times of cleaning. Then, the flow returns to step S1, and the film forming process is performed in a similar manner as described above.

If it is determined that the number of times of cleaning is equal to or more than 20 times (step S4: No), the cleaning process B is performed (step S7). Hereinafter, the cleaning process B will be described. FIGS. 9A to 9E show an example of the cleaning recipe of the cleaning process B.

First, the CPU 115 sets the interior of the reaction tube 2 to have a predetermined temperature, for example, 300 degrees C. as shown in FIG. 9A. In addition, as shown in FIG. 9C, a predetermined amount of nitrogen is supplied into the reaction tube 2 from the purge gas supply pipe 18, and an empty wafer boat 11 in which a semiconductor wafer W is not accumulated is loaded on the cover 6. Then, the cover 6 is lifted by the boat elevation unit 128 to load the wafer boat 11 into the reaction tube 2 (loading process).

Next, as shown in FIG. 9C, a predetermined amount of nitrogen is supplied into the reaction tube 2 from the purge gas supply pipe 18, and the interior of the reaction tube 2 is set to have a predetermined temperature, for example, 300 degrees C. as shown in FIG. 9A. In addition, the gas within the reaction tube 2 is discharged to decompress the interior of the reaction tube 2 to have a predetermined pressure, for example, 53200 Pa (400 Torr) as shown in FIG. 9B. The compression and the temperature continue to be controlled until the interior of the reaction tube 2 is stabilized at the predetermined pressure and the predetermined temperature (stabilization process).

When the interior of the reaction tube 2 is stabilized at the predetermined pressure and temperature, the supply of the nitrogen from the purge gas supply pipe 18 is stopped, and the cleaning gas is introduced into the reaction tube 2 from the treatment gas introduction pipe 17. In this embodiment, the dilution gas including 2 liters per minute of fluoride ($F_2$) as shown in FIG. 9D, 2 liters per minute of hydrogen fluoride (HF) as shown in FIG. 9E and 8 liters per minute of nitrogen as the dilution gas as shown in FIG. 9C is introduced into the reaction tube 2.

When the cleaning gas is introduced into the reaction tube 2, the cleaning gas is heated within the reaction tube 2, and fluorine included in the cleaning gas is activated. The activated fluorine contacts the extraneous particles (silicon nitride) attached to the interior of the heat treatment apparatus 1 such that the silicon nitride is etched. Accordingly, the extraneous particles attached to the interior of the heat treatment apparatus 1 is removed (cleaning process).

When the extraneous particles attached to the interior of the heat treatment apparatus 1 is removed, the supply of the cleaning gas from the treatment gas introduction pipe 17 is stopped. Then, the gas within the reaction tube 2 is discharged, and a predetermined amount of nitrogen is supplied into the reaction tube 2 from the purge gas supply pipe 18 as shown in FIG. 9C to discharge the gas within the reaction tube 2 to the exhaust pipe 5 (purging process). Further, in order to reliably discharge the gas within the reaction tube 2, discharging the gas within the reaction tube 2 and supplying the nitrogen gas are repeated several times in some embodiment.

Then, a predetermined amount of nitrogen is supplied into the reaction tube 2 from the purge gas supply pipe 18 as shown in FIG. 9C to return the interior of the reaction tube 2 to the normal pressure as shown in FIG. 9B. In addition, the interior of the reaction tube 2 is set to have a predetermined temperature, for example, 300 degrees C. as shown in FIG. 9A. Finally, the cover 6 is lowered by the boat elevation unit 128 to unload the wafer boat 11 from the reaction tube 2 (unloading process). Accordingly, the cleaning process B is completed.

When the cleaning process B is completed, the CPU 115 clears the stored accumulative film thickness value and the number of times of cleaning (step S8). Then, the flow returns to step S1, and the film forming process is performed in a similar manner as described above.

Then, if it is determined that the film forming process is performed the number of times for completion (e.g., 500 times as shown in FIG. 5) (step S2: Yes), the film forming process is completed.

Since it was checked whether the extraneous particles are attached to the interior of the heat treatment apparatus 1 after the cleaning process B in the film forming process as mentioned above, a check is made to determine whether the extraneous particles are not attached to the interior of the heat treatment apparatus 1. Thus, it is possible to reliably clean the heat treatment apparatus 1 by the cleaning process in the film forming process. Therefore, it is possible to extend the operation time of the apparatus or the use time of the reaction tube 2 (quartz).

Further, since the mixture gas of fluorine and nitrogen is used as the cleaning gas in the cleaning process A, and the mixture gas of fluorine, hydrogen fluoride and nitrogen is used as the cleaning gas in the cleaning process B, the cleaning process A is performed in the cleaning process such that the hydrogen fluoride does not need to be used in comparison to a case where the cleaning process B is performed, and thus it is possible to reduce the amount of the cleaning gas.

As described above, according to the embodiment, it is possible to perform the cleaning in accordance with a situation of the apparatus, since two types of the cleaning processes are separately used according to the accumulative film thickness after the film forming process and the number of times of cleaning.

Further, the present disclosure can be variably modified and applied without being limited to the foregoing embodiment. Hereinafter, different embodiments applicable to the present disclosure will be described.

Although the case where the cleaning start condition includes the accumulated film thickness after the film forming process and the number of times of cleaning as an example is described in the foregoing embodiment, the cleaning start condition may include various determination conditions, for example, the number of times of performing of the film forming recipe, the total number of times of performing the film forming recipe and the cleaning recipe, and the like.

Although the case where the two kinds of the cleaning processes are separately used is described in the foregoing embodiment, for example, at least three kinds of cleaning processes may be separately used. In this case, the cleaning may further be performed in accordance with a situation of the apparatus.

Although the case where the mixture gas of fluorine and nitrogen, and the mixture gas of fluorine, hydrogen fluoride and nitrogen are used as the cleaning gas in the foregoing embodiment, the cleaning gas may include a cleaning gas capable of removing the extraneous particles attached to the interior of the apparatus, and various gases may also be used as the cleaning gas.

Although the case where the silicon nitride film is formed is taken as an example in the foregoing embodiment, other types of thin film can be chosen. For example, the thin film may include a silicon oxide film, a poly-silicon film and the like. Further, the film forming gas used when the silicon nitride film is formed may not be limited to DSC and ammonia. For example, the film forming gas may include hexachlorodisilane (HCD) and ammonia.

Although the case of the batch type heat treatment apparatus having a single tube structure is taken as an example in the foregoing embodiment, the present disclosure may also be applied to, for example, a batch type vertical heat treatment apparatus having a dual tube structure including the reaction tube 2 which includes an inner tube and an outer tube. Further, the present disclosure may be applied to, for example, the process of a flat panel display (FPD) substrate, a glass substrate, a plasma display panel (PDP) substrate and the like, rather than being limited to a semiconductor wafer.

The controller 100 according to the embodiment of the present disclosure can be implemented by using a general-purpose computer system instead of a dedicated controller. For example, the controller 100 for performing the aforementioned processes can be configured by installing programs for execution of the processes into a general-purpose computer through the use of a recording medium (e.g., flexible disk or compact disc read only memory (CD-ROM)) storing the programs.

Also, the programs can be provided by any means. The programs may be provided not only by the storage medium mentioned above but also through a communication line, a communication network or a communication system. In this case, the programs may be posted on a bulletin board system (BBS) and provided through a network by imposing it on carrier waves. Thus, the programs provided as mentioned above are started up and executed in the same manner as other application programs under the control of an operating system (OS), thereby performing the processes described above.

The present disclosure in some embodiments is useful to a thin film forming apparatus, which forms a thin film on a target object such as a semiconductor wafer.

According to the present disclosure, it is possible in some embodiments to perform the cleaning in accordance with the situation of the apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of cleaning a thin film forming apparatus wherein a process for supplying a film forming gas into a reaction tube of the thin film forming apparatus to form a thin film on an object to be processed is repeated more than one time, the method comprising:
 a cleaning process where a cleaning gas is supplied into the reaction tube to remove extraneous particles attached to an interior of the thin film forming apparatus, including a first cleaning process and a second cleaning process,
 wherein the first cleaning process includes supplying a first cleaning gas into the reaction tube to remove the extraneous particles attached to the interior of the apparatus, the first cleaning process being performed if a number of times of cleaning is less than a predetermined number of times; and
 the second cleaning process includes supplying a second cleaning gas, the second cleaning process being performed if the number of times of cleaning is greater than or equal to the predetermined number of times,
 wherein a mixture gas of fluorine and nitrogen is used as the first cleaning gas, and a mixture gas of fluorine, hydrogen fluoride and nitrogen is used as the second cleaning gas.

2. The method of claim 1, wherein the first cleaning process and the second cleaning process include a first cleaning start condition and a second cleaning start condition, respectively, and each of the first cleaning start condition and the second cleaning condition includes at least one condition in addition to the number of times of cleaning.

3. A thin film forming apparatus for supplying a film forming gas into a reaction tube of the thin film forming apparatus to form a thin film on an object to be processed, the apparatus comprising:
 a first gas introduction pipe configured to introduce a second cleaning gas into the reaction tube;
 a second gas introduction pipe configured to introduce a second cleaning gas into the reaction tube; and
 a controller configured to perform a cleaning process where a cleaning gas is supplied into the reaction tube to remove extraneous particles attached to an interior of the thin film forming apparatus, the cleaning process including a first cleaning process and a second cleaning process, the first cleaning process including supplying the first cleaning gas into the reaction tube through the first gas introduction pipe to remove the extraneous particles attached to the interior of the apparatus, the first cleaning process being performed if a number of times of cleaning is less than a predetermined number of times, and
 the second cleaning process including supplying the second cleaning gas through the second gas introduction pipe into the reaction tube, the second cleaning process being performed if the number of times of cleaning is greater than or equal to the predetermined number of times,
 wherein a mixture gas of fluorine and nitrogen is used as the first cleaning gas, and a mixture gas of fluorine, hydrogen fluoride and nitrogen is used as the second cleaning gas.

4. A non-transitory computer readable medium for storing a computer program used in a thin film forming apparatus configured to supply a film forming gas into a reaction tube of the thin film forming apparatus to form a thin film on an object to be processed, the computer program comprising:
 a cleaning process instruction set to perform a cleaning process where a cleaning gas is supplied into the reaction tube to remove extraneous particles attached to an interior of the thin film forming apparatus, including a first cleaning process instruction and a second cleaning process instruction,
 wherein the first cleaning process instruction is set to perform a first cleaning process including supplying a first cleaning gas into the reaction tube to remove the extraneous particles attached to the interior of the apparatus, the first cleaning process being performed if a number of times of cleaning is less than a predetermined number of times; and the second cleaning process instruction is set to perform a second cleaning process including supplying a second cleaning gas, the second cleaning process being performed if the number of times of cleaning is greater than or equal to the predetermined number of times, wherein a mixture gas of fluoride and nitrogen is used as the first cleaning gas, and a mixture gas of fluorine, hydrogen fluoride and nitrogen is used as the second cleaning gas.

* * * * *